United States Patent
Yang et al.

(10) Patent No.: US 6,248,644 B1
(45) Date of Patent: Jun. 19, 2001

(54) METHOD OF FABRICATING SHALLOW TRENCH ISOLATION STRUCTURE

(75) Inventors: Gwo-Shii Yang; Hsueh-Hao Shih, both of Hsinchu; Chih-Chien Liu, Taipei; Tri-Rung Yew, Hsinchu Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/301,210

(22) Filed: Apr. 28, 1999

(51) Int. Cl.[7] .................................................. H01L 21/76
(52) U.S. Cl. ............................................................. 438/424
(58) Field of Search ..................................... 438/424, 425, 438/426, 427, 689, 691, 700, 431

(56) References Cited

U.S. PATENT DOCUMENTS 5,492,858 * 2/1996 Bose et al. .............................. 437/67
5,989,978 * 11/1999 Peidous ................................. 438/436

* cited by examiner

*Primary Examiner*—David Nelms
*Assistant Examiner*—Quoc Hoang
(74) *Attorney, Agent, or Firm*—Thomas, Kayden, Horstemeyer & Risley

(57) ABSTRACT

A method of fabricating a shallow trench isolation structure is described. A preserve layer is formed on a substrate. A trench is formed in the substrate and the preserve layer. An oxide layer is formed over the substrate to fill the trench. A wet densification step is performed in a moist environment. A planarization step is performed until the preserve layer is exposed. A shallow trench isolation structure is formed.

9 Claims, 2 Drawing Sheets

METHOD OF FABRICATING SHALLOW TRENCH ISOLATION STRUCTURE

BACKGROUND OF THE INVENTION

1. Field of the Invention

The present invention relates to a semiconductor fabricating method. More particularly, the present invention relates to a method of fabricating a shallow trench isolation (STI) structure.

2. Description of the Related Art

An isolation region is formed in an integrated circuit for the purpose of separating neighboring device regions of a substrate and preventing the carriers from penetrating through the substrate to neighboring devices. For example, isolation regions are used to isolate field effect transistors (FETs) from each other in order to prevent current leakage among the FETs.

Shallow trench isolation (STI) technique is a common method of forming isolation regions. STI structure is formed by first anisotropically etching to form a trench in the substrate, and then depositing oxide in the trench to form an isolation region. Since STI structure is scaleable, it has become widely used for forming sub-micron CMOS circuits.

In FIG. 1, a preserve layer 102 is formed on a substrate 100. A photolithographic and etching process is performed to form a trench 104 in the substrate 100 and the preserve layer 102. A low-pressure chemical vapor deposition is performed with tetra-ethyl-ortho-silicate (TEOS) serving as a gas source. An oxide layer 106 is formed to cover the preserve layer 102 and fill the trench 104. The oxide layer 106 is deposited in such way that the oxide layer 106 is conformal to the trench 104 and gradually gets thicker to fill the trench 104. Thus, a seam 108 is formed in the oxide layer 106 between opposite sidewalls of the trench 104. A dry densification is performed in nitrogen environment or oxygen environment. A chemical-mechanical polishing and a dip step are performed in sequence. However, the seam 108 is easily exposed after the chemical-mechanical polishing step. The dip step even expends the seam 108. Thus, defects usually form in the STI structure.

In the conventional STI structure, a seam easily forms in a trench after an oxide layer is deposited in the trench. If a trench with a high aspect ratio is provided, a void may even form in the oxide layer after depositing the oxide layer into the trench. The seam or void is likely to remain in the oxide layer even after the performance of a dry densification. In this manner, after the planarization step, the seam or void is easily exposed. Once the seam or void is exposed, it is easily to be enlarged during a dip step. This, in turn, causes current leakage and device failure to occur.

SUMMARY OF THE INVENTION

The invention provides a method of fabricating a shallow trench isolation structure. A preserve layer is formed on a substrate. A trench is formed in the substrate and the preserve layer. An oxide layer is formed over the substrate to fill the trench. A wet densification step is performed in a moist environment. The oxide layer outside the trench is removed.

In the present invention, a wet densification step is performed in a moist environment. Oxygen radicals are generated in the moist environment during the performance of the wet densification step. The oxygen radicals penetrate into the seam to bond with the dangling bonds along the seam. Thus, portions of the oxide layer beside the seam are bonded and the seam is eliminated. The quality of the STI structure is enhanced.

In addition, the oxygen radicals penetrate into the oxide layer to make contact with the top corner and the bottom corner of the trench 204. It leads to the occurrence of an additional oxidation step. A right-angled bottom and a right-angled top corner are further oxidized into smooth corners. Thus, the stress of the top and bottom corners is reduced and kink effect does not occur.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
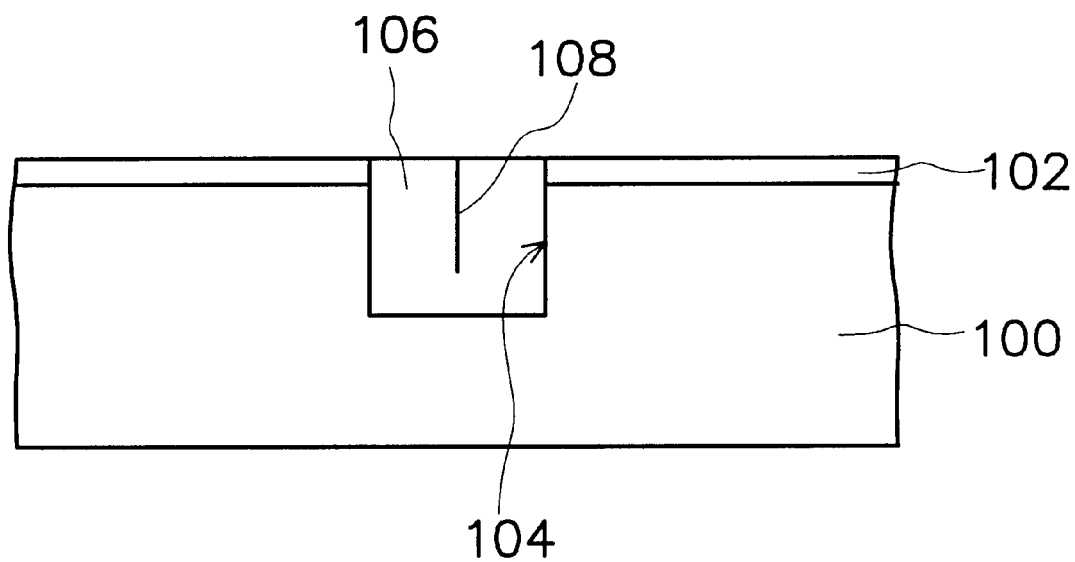
FIG. 1 is a schematic, cross-sectional view showing a conventional shallow trench isolation structure.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
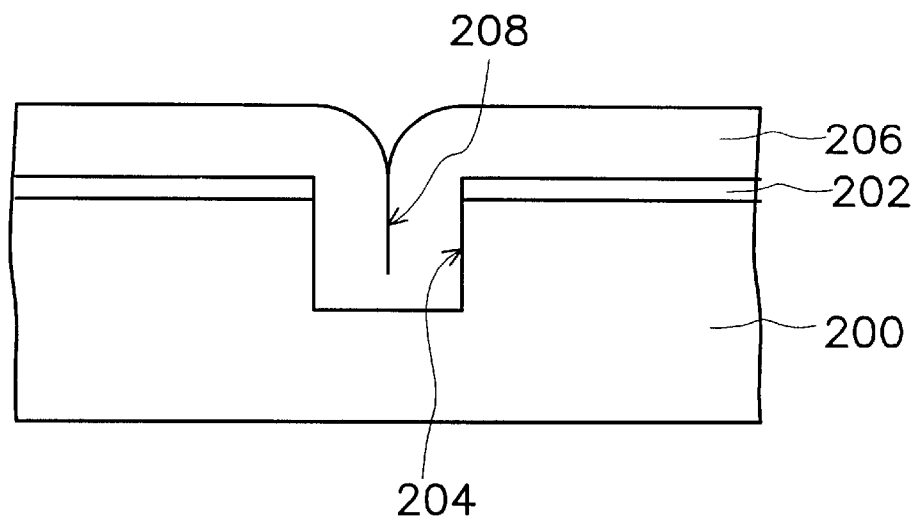
FIGS. 2A through 2C are schematic, cross-sectional views showing a shallow trench isolation structure according to one preferred embodiment of the invention.

In FIG. 2A, a preserve layer 202 is formed over the substrate 200. A trench 204 is formed in the substrate 200 and the preserve layer 202 by, for example, a photolithographic and etching process. The material of the preserve layer 202 comprises silicon nitride. An oxide layer 206 is formed on the preserve layer 202 to fill the trench 204. The oxide layer 206 can be formed by, for example, low-pressure chemical vapor deposition with TEOS serving as a gas source. A seam 208 is formed in the oxide layer 206 between opposite sidewalls of the trench 204 after the oxide layer 206 is formed.

Figure 2B:
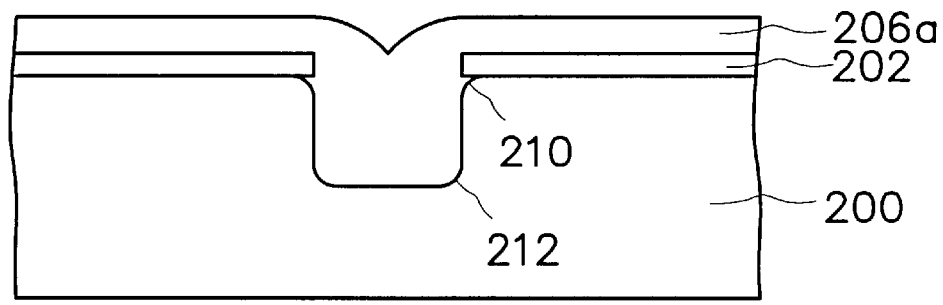

In FIG. 2B, a wet densification step is performed in a moist environment. The oxide layer 206 (shown in FIG. 2A) thus is converted into a densified oxide layer 206a. The wet densification step can be performed by, for example, a thermal process in a moist environment. Since oxygen radicals are generated in the environment during wet densification, the oxygen radicals penetrate into the seam 208 to make the dangling bonds of the oxide layer 206a between the seam 208 bond together. Thus, the seam 208 in the oxide layer 206a is eliminated after the wet densification step. In addition, the oxygen radicals penetrates into the oxide layer 206a to make contact with the top corner 210 and the bottom corner 212 of the trench 204. This causes an additional oxidation step to occur. Thus, right-angled bottom corner 212 and top corners 210 are further oxidized into smooth corners. The stress of the top and bottom corners 210 and 212 is reduced, and therefore the kink effect does not occur.

Figure 2C:
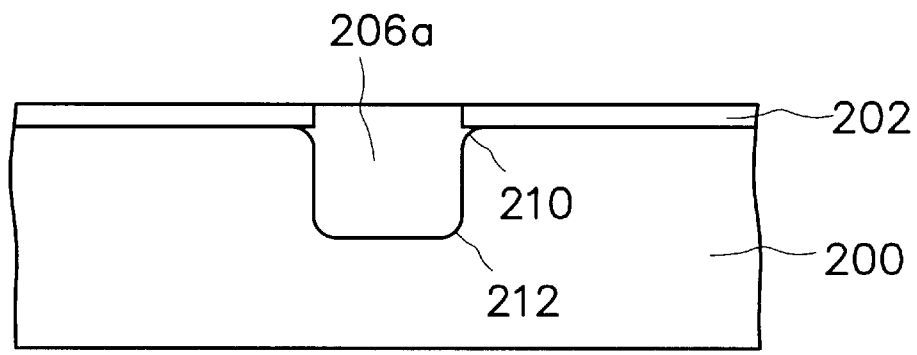

In FIG. 2C, the oxide layer 206a is planarized until the preserve layer 202 is exposed. The planarization process comprises a chemical-mechanical polishing step. A dip step, such as a HF dip step, is performed to remove impurities over the substrate 200. The dip step is preferably performed for about 10 seconds to 20 seconds.

Accordingly, a wet densification step is performed in a moist environment after the formation of an oxide layer. The wet densification step generates oxygen radicals that bond the dangling bonds of the oxide layer besides the seam. The seam is thus eliminated. In addition, the oxygen radicals causes the top corner and bottom corner to be further oxidized. In this manner, the angles of the top corner and the bottom corner become smooth. Thus, the stress in the STI structure can be reduced and the occurrence of the kink effect can be avoided.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a shallow trench isolation structure, comprising the steps of:

forming a preserve layer over a substrate;

forming a trench in the substrate and the preserve layer, wherein the trench has a top corner and a bottom corner;

forming an oxide layer over the substrate to fill the trench;

performing a wet densification step in a moist environment, wherein the top corner and the bottom corner are oxidized into smooth corners; and removing the oxide layer outside the trench.

2. The method of claim 1, wherein the oxide layer is formed by chemical vapor deposition.

3. The method of claim 2, wherein the oxide layer is formed by low-pressure chemical vapor deposition with tetra-ethyl-ortho-silicate serving as a gas source.

4. The method of claim 1, further comprising forming a preserve layer on a substrate before the step forming the trench in the substrate.

5. The method of claim 1, wherein the trench is formed by a photolithographic and etching process.

6. The method of claim 1, wherein the wet densification step comprises a thermal process.

7. The method of claim 1, wherein the step of forming the oxide layer over the substrate comprises chemical vapor deposition.

8. The method of claim 1, further comprising performing a dip step after removing the oxide layer outside the trench.

9. The method of claim 8, wherein in the dip step comprises a HF dip step.

* * * * *